United States Patent
Rhee et al.

(10) Patent No.: US 8,310,886 B2
(45) Date of Patent: Nov. 13, 2012

(54) DELAY LOCKED LOOP USING HYBRID FIR FILTERING TECHNIQUE AND SEMICONDUCTOR MEMORY DEVICE HAVING THE SAME

(75) Inventors: Woogeun Rhee, Beijing (CN); Xueyi Yu, Beijing (CN); Sung Cheol Shin, Seoul (KR); Zhihua Wang, Beijing (CN)

(73) Assignees: Samsung Electronics Co., Ltd., Gyeonggi-do (KR); Tsinghua University, Beijing (CN)

( * ) Notice: Subject to any disclaimer, the term of this patent is extended or adjusted under 35 U.S.C. 154(b) by 313 days.

(21) Appl. No.: 12/801,832

(22) Filed: Jun. 28, 2010

(65) Prior Publication Data

US 2011/0002181 A1    Jan. 6, 2011

(30) Foreign Application Priority Data

Jul. 1, 2009    (KR) .................. 10-2009-0059579

(51) Int. Cl.
*G11C 7/00*    (2006.01)
(52) U.S. Cl. ................ 365/194; 365/193; 365/233.1; 327/291; 327/298; 327/407
(58) Field of Classification Search .................. 365/193, 365/194, 233.1; 327/291, 298, 407
See application file for complete search history.

(56) References Cited

U.S. PATENT DOCUMENTS

| | | | |
|---|---|---|---|
| 6,078,514 A * | 6/2000 | Takemae et al. ................ 365/63 |
| 6,339,553 B1 * | 1/2002 | Kuge ............................ 365/194 |
| 6,373,303 B2 * | 4/2002 | Akita ........................... 327/156 |
| 6,636,110 B1 * | 10/2003 | Ooishi et al. .................. 327/565 |
| 6,836,517 B2 | 12/2004 | Nagatani et al. |
| 6,914,852 B2 * | 7/2005 | Choi ........................ 365/189.14 |
| 6,937,076 B2 * | 8/2005 | Gomm ......................... 327/158 |
| 7,116,143 B2 * | 10/2006 | Deivasigamani et al. .... 327/149 |
| 7,227,809 B2 * | 6/2007 | Kwak ...................... 365/189.15 |
| 7,259,604 B2 * | 8/2007 | Gomm ......................... 327/175 |
| 7,319,728 B2 * | 1/2008 | Bell et al. ...................... 375/354 |
| 7,330,060 B2 | 2/2008 | Abel et al. |
| 7,366,965 B2 * | 4/2008 | Yamasaki et al. ............. 714/718 |
| 7,576,579 B2 * | 8/2009 | Fujisawa et al. ............. 327/158 |
| 8,018,261 B2 * | 9/2011 | Becker et al. ................ 327/175 |
| 2006/0056536 A1 | 3/2006 | Hori et al. |

FOREIGN PATENT DOCUMENTS

| | | |
|---|---|---|
| JP | 2001-189685 | 7/2001 |
| JP | 2006-080931 | 3/2006 |
| KR | 10-2006-0023936 | 3/2006 |

* cited by examiner

*Primary Examiner* — Viet Q Nguyen
(74) *Attorney, Agent, or Firm* — Harness, Dickey & Pierce, P.L.C.

(57) ABSTRACT

Example embodiments are directed to a delay locked loop (DLL) circuit based on a hybrid finite impulse response (FIR) filtering technique, and a semiconductor memory device including the DLL circuit. The DLL circuit includes a frequency divider and a self-referenced multiphase generator (SRMG) and allows a Sigma-Delta ($\Sigma\Delta$) modulator to operate at a low frequency without generating false lock and glitch noise.

17 Claims, 6 Drawing Sheets

DELAY LOCKED LOOP USING HYBRID FIR FILTERING TECHNIQUE AND SEMICONDUCTOR MEMORY DEVICE HAVING THE SAME

CROSS-REFERENCE TO RELATED APPLICATIONS

This application claims priority under 35 U.S.C. §119 to Korean Patent Application No. 10-2009-0059579, filed on Jul. 1, 2009, in the Korean Intellectual Property Office (KIPO), the entire contents of which are incorporated herein by reference.

BACKGROUND

Example embodiments relate to delay locked loop (DLL) circuits, and particularly, to a DLL circuit that includes a frequency divider and multiphase generator (SRMG) having a self-referenced characteristics and allows a sigma-delta ($\Sigma\Delta$) modulator to operate at a low frequency without generating false lock and glitch noise, and a semiconductor memory device including the DLL circuit.

Synchronous semiconductor memory devices, for example, double data rate synchronous DRAMs (DDR SDRAMs), may input or output data in synchronization with an external clock signal. For example, the synchronous semiconductor memory devices may use a DLL circuit in order to synchronize data with the external clock signal.

Conventional analog DLLs have a limited phase capture range, and conventional semi-digital DLLs have a limited phase resolution. Thus, conventional DLLs generate jitter.

In addition, conventional DLLs do not have a jitter transfer function as good as phase locked loops (PLLs), thus requiring a high over-sampling ratio.

SUMMARY

According to example embodiments, a delay locked loop (DLL) circuit includes a phase control circuit including a voltage-controlled delay line (VCDL) configured to generate an output signal based on a feedback signal output in response to a plurality of control signals, and an input signal; a plurality of phase detection circuits, each phase detection circuit configured to compare a phase of a signal selected from a signal set, the signal set including signals with different phases, with a phase of a reference signal and configured to output a control signal of the plurality of control signals that corresponds to a phase difference between the selected signal and the reference signal; a multiphase generation circuit configured to output the signal set based on the signal output from the phase control circuit, the input signal, and a first frequency-divided signal obtained by dividing a frequency of the input signal; and a sigma-delta ($\Sigma\Delta$) modulation circuit configured to output a plurality of delay selection control signals having different phases and transmit the plurality of delay selection control signals to the plurality of phase detection circuits, the plurality of delay selection control signals output in response to a second frequency-divided signal having a phase different from a phase of the first frequency-divided signal.

According to example embodiments, each of the plurality of phase detection circuits includes a selection circuit configured to select the signal from the signal set in response to a corresponding selection control signal of the plurality of selection control signals; and a phase detector (PD) configured to output the control signal corresponding to the phase difference between the selected signal selected by the selection circuit and the reference signal.

According to example embodiments, the multiphase generation circuit includes a frequency divider configured to divide the frequency of the input signal to generate the first frequency-divided signal and the second frequency-divided signal; and a self-referenced multiphase generator (SRMG) configured to output the multiphase signal set and the reference signal in response to the output signal of the VCDL, the input signal, and the first frequency-divided signal.

According to example embodiments, the sigma-delta ($\Sigma\Delta$) modulation circuit includes a $\Sigma\Delta$ modulator configured to generate a selection control signal in response to the second frequency-divided signal output from the frequency divider; and a delay circuit configured to generate the plurality of delay selection control signals by delaying the selection control signal output from the $\Sigma\Delta$ modulator and to transmit the plurality of delay selection control signals to the plurality of phase detection circuits.

According to example embodiments, the phase control circuit further includes a charge pump (CP) configured to generate a charge pump current in response to the control signal output from each of the plurality of phase detection circuits.

According to example embodiments, the CP includes a plurality of current steering blocks, each configured to output a sub-charge pump current on the basis of the control signal output from one of the plurality of PDs; and a peripheral circuit configured to sum the sub-charge pump currents output from the plurality of current steering blocks and to generate the charge pump current based on a result of the summation.

According to example embodiments, the plurality of current steering blocks operate independently.

According to example embodiments, the SRMG includes a plurality of first D-flip-flops (DFFs) configured to output the signal set including signals with different phases in response to the input signal and the first frequency-divided signal; and a second DFF configured to output the reference signal in response to one of the signals of the signal set output from the plurality of first DFFs and the signal output by the VCDL.

According to example embodiments, a semiconductor memory device includes a memory cell array; a delay locked loop (DLL) circuit configured to generate a plurality of feedback signals based on a first frequency-divided signal obtained by frequency-dividing an input signal, the generated feedback signals having different phases, and the DLL configured to generate an output signal synchronized with the input signal based on at least one feedback signal of the generated feedback signals; and an input/output circuit configured to transmit a first data from an external source to the memory cell array in response to the output signal or transmit a second data from the memory cell array to the external source in response to the output signal.

According to example embodiments, the DLL circuit includes a frequency divider configured to divide a frequency of the input signal to output the first frequency-divided signal and a second frequency-divided signal; and a sigma-delta ($\Sigma\Delta$) modulator configured to operate based on the second frequency-divided signal output from the frequency divider, and output a selection control signal, the output selection control signal adjusting a phase resolution of the DLL circuit.

According to example embodiments, the DLL circuit includes a self-referenced multiphase generator (SRMG) configured to generate the feedback signals having different phases, the feedback signals generated based on the input signal, the first frequency-divided signal, and the output signal of the DLL circuit; and a selection circuit configured to select one feedback signal from the feedback signals generated by the SRMG based on the selection control signal.

According to example embodiments, the DLL circuit includes a phase control circuit including a voltage-controlled delay line (VCDL) configured to output a signal based on the output signal generated by the DLL circuit and the input signal; a plurality of phase detection circuits, each phase detection circuit configured to compare a phase of the at least one feedback signal of the generated feedback signals with a phase of a reference signal and configured to output a control signal that corresponds to a phase difference between the at least one feedback signal and the reference signal; a multiphase generation circuit configured to output the plurality of feedback signals in response to the signal output from the phase control circuit, the input signal, and the first frequency-divided signal; and a sigma-delta (ΣΔ) modulation circuit configured to output a plurality of delay selection control signals having different phases and transmit the plurality of delay selection control signals to the plurality of phase detection circuits, the plurality of delay selection control signals output in response to a second frequency-divided signal having a phase different from a phase of the first frequency-divided signal.

According to example embodiments, each of the plurality of phase detection circuits includes a selection circuit configured to select the at least one feedback signal of the generated feedback signals in response to a corresponding delay selection control signal of the plurality of delay selection control signals output from the ΣΔ modulation circuit; and a phase detector (PD) configured to output the control signal corresponding to the phase difference between the at least one feedback signal selected by the selection circuit and the reference signal.

According to example embodiments, the multiphase generation circuit includes a frequency divider configured to divide the frequency of the input signal to generate the first frequency-divided signal and the second frequency-divided signal; and a self-referenced multiphase generator (SRMG) configured to generate the plurality of feedback signals having different phases and the reference signal in response to the output signal of the VCDL, the input signal, and the first frequency-divided signal.

According to example embodiments, the sigma-delta (ΣΔ) modulation circuit includes a ΣΔ modulator configured to generate a selection control signal in response to the second frequency-divided signal output from the frequency divider; and a delay circuit configured to generate the plurality of delay selection control signals by delaying the selection control signal output from the ΣΔ modulator and to transmit the plurality of delay selection control signals to the plurality of phase detection circuits.

According to example embodiments, the phase control circuit further includes a charge pump (CP) configured to generate a charge pump current in response to the control signal output from each of the plurality of phase detection circuits.

According to example embodiments, the CP includes a plurality of current steering blocks, each configured to output a sub-charge pump current based on the control signal output from one of the plurality of PDs; and a peripheral circuit configured to sum the sub-charge pump currents output from the plurality of current steering blocks and to generate the charge pump current based on a result of the summation.

According to example embodiments, the plurality of current steering blocks operate independently.

According to example embodiments, the SRMG includes a plurality of first D-flip-flops (DFFs) configured to generate the plurality of feedback signals having different phases in response to the input signal and the first frequency-divided signal; and a second DFF configured to output the reference signal in response to at least one of the plurality of feedback signals generated by the plurality of first DFFs and the signal output by the VCDL.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
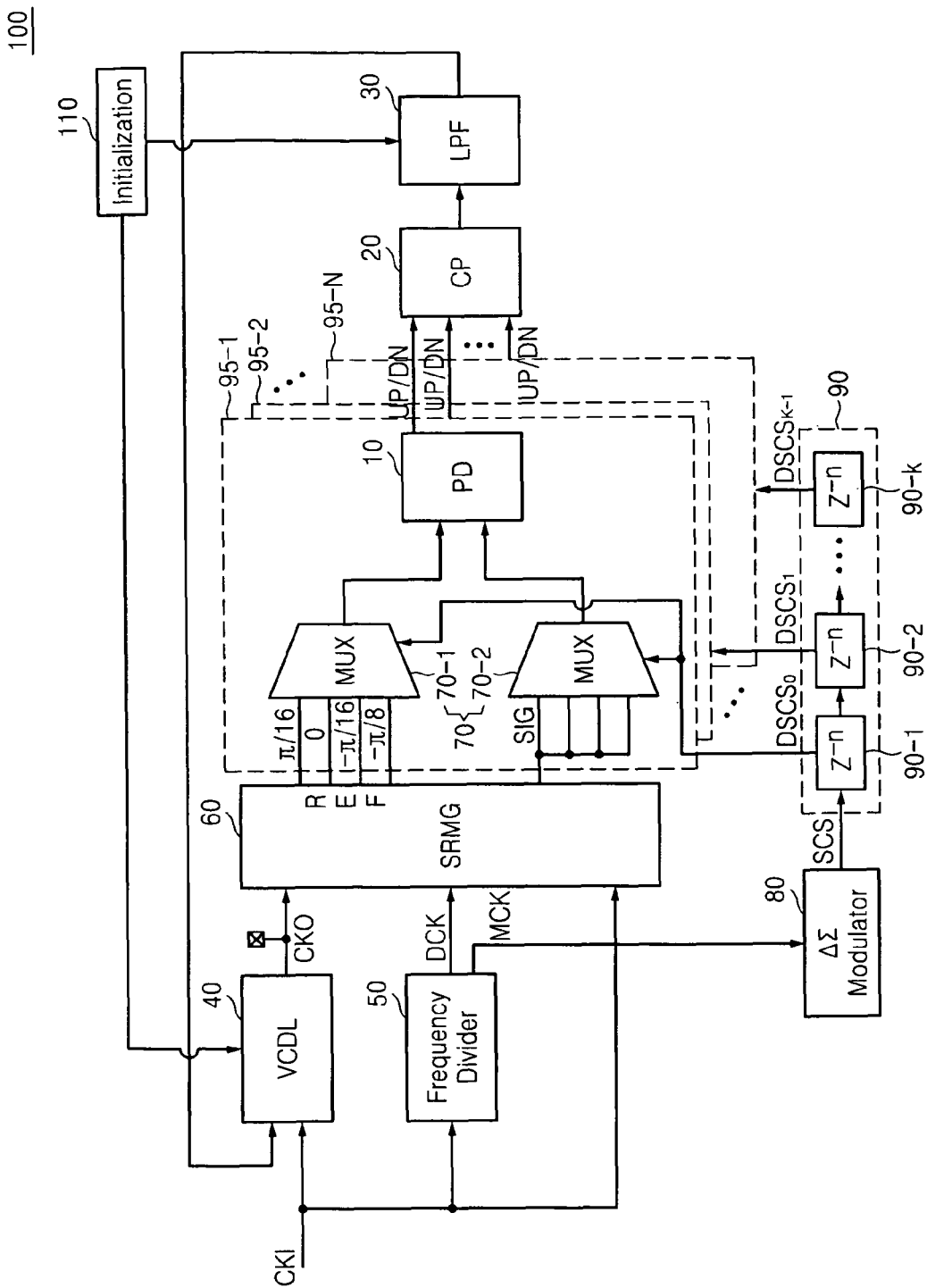
FIG. 1 is a block diagram of a delay locked loop (DLL) circuit according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a delay locked loop (DLL) circuit 100 according to example embodiments. Referring to FIG. 1, the DLL circuit 100 may include a phase detector (PD) 10, a charge pump (CP) 20, a low pass filter (LPF) 30, a voltage-controlled delay line (VCDL) 40, a frequency divider 50, a self-referenced multiphase generator (SRMG) 60, a selection circuit 70, a sigma-delta (ΣΔ) modulator 80, and a delay circuit 90.

The PD 10 may receive a reference signal SIG and a feedback signal REF from the selection circuit 70 and output a control signal UP or DN corresponding to a difference between the phases of the reference signal SIG and the feedback signal REF. In detail, the PD 10 may output the control signal UP or DN corresponding to a difference between the phases of the reference signal SIG and one feedback signal selected from a plurality of feedback signals (for example, feedback signals REFπ/16, REF0, REF-π/16, and REF-π/8 of FIG. 1) output from the SRMG 60 and selected by the selection circuit 70.

The PD 10 may output a first signal (for example, the control signal UP) when the phase of the reference signal SIG lags behind the phase of the selected feedback signal. Similarly, the PD 10 may output a second signal (for example, the control signal DN) when the phase of the reference signal SIG leads the phase of the selected feedback signal.

The DLL circuit 100 may include a plurality of phase detection blocks 95-1, 95-2, . . . , and 95-N (where N denotes a natural number). Each of the phase detection blocks 95-1, 95-2, . . . , and 95-N may include the selection circuit 70 and the PD 10. Thus, the DLL circuit 100 operates the phase detection blocks 95-1, 95-2, . . . , and 95-N in parallel, thereby increasing a signal processing speed.

The CP 20 may output a charge pump current in response to the control signal UP or DN output received from the PDs 10 included in the phase detection blocks 95-1, 95-2, . . . , and 95-N. The CP 20 may include a plurality of current steering blocks 21 (see FIG. 3A) that are controlled by the control signals UP or DN output from the PDs 10. The CP 20 may sum the outputs of the current steering blocks 21 and generate the charge pump current on the basis of a result of the summation.

According to example embodiments, the DLL circuit 100 has a high phase resolution. Thus, an on-chip test circuit (not shown) based on the CP 20 may be used to monitor the linearity of phase interpolation. An operational principle or a structure of the CP 20 will be described with reference to FIG. 3A.

The LPF 30 may perform low pass filtering on the charge pump current output from the CP 20. Thus, noise existing in a high pass band may be effectively removed. Noise or Alternating Current (AC) components may also be removed by the LPF 30, and a signal output from the LPF 30 may be transmitted to the VCDL 40.

The VCDL 40 may generate an output signal CKO by delaying an input signal CKI for a desired period of time on the basis of the signal output from the LPF 30, and output the output signal CKO. According to example embodiments, the VCDL 40 may be designed to have a phase span of 6π radian. The VCDL 40 may be controlled by a source follower (not shown) so as to have a high power supply rejection ratio (PSRR).

In order to increase the limited phase capture range of the VCDL 40, the DLL circuit 100 may further include an initialization block 110. The initialization block 110 may reset at least one of the VCDL 40 and the LPF 30 before an operation of the DLL circuit 100 starts.

The frequency divider 50 may perform frequency division on the input signal CKI and output two signals DCK and MCK, namely, first and second signals DCK and MCK, corresponding to a result of the frequency division. For example, the first and second signals DCK and MCK may be obtained by dividing the frequency of the input signal CKI by a natural number, and thus the following relationship may be established as given by:

$$f_{DCK}(=f_{MCK})=f_{CKI} \times N \text{ (where } N \text{ denotes a natural number)} \quad \text{[Equation 1]}$$

where $f_{DCK}$ denotes a frequency of the first signal DCK, $f_{MCK}$ denotes a frequency of the second signal MCK, and $f_{CKI}$ denotes a frequency of the input signal CKI. The first and second signals DCK and MCK output from the frequency divider 50 may have different level transition time points.

For example, a point in time when the first signal DCK transitions from a first level (or a second level) to the second level (or the first level) may be different from a point in time when the second signal MCK transitions from the first level (or the second level) to the second level (or the first level). Alternatively, according to example embodiments, a period of time during which the first signal DCK maintains the second level (for example, a high level) may not be overlapped by a period of time during which the second signal MCK maintains the second level (for example, the high level). The first signal DCK may be transmitted to the SRMG 60, and the second signal MCK may be transmitted to the sigma-delta (ΣΔ) modulator 80.

The SRMG 60 may generate the reference signal SIG and a plurality of feedback signals, namely, the feedback signals REFπ/16, REF0, REF-π/16, and REF-π/8, having different phases on the basis of the output signal CKO output from the VCDL 40, the first signal DCK output from the frequency divider 50, and the input signal CKI.

Although the SRMG 60 generates the four feedback signals REFπ/16, REF0, REF-π/16, and REF-π/8 in the embodiment of FIG. 1, example embodiments are not limited thereto, and a number of feedback signals generated may be greater than or less than four. An operational principle or a structure of the SRMG 60 is described with reference to FIG. 2.

The selection circuit 70 may select one of the four feedback signals REFπ/16, REF0, REF-π/16, and REF-π/8 output from the SRMG 60 in response to a selection control signal SCS output from the sigma-delta (ΣΔ) modulator 80 and transmit the selected feedback signal REFπ/16, REF0, REF-π/16, or REF-π/8 to the PD 10. According to example embodiments, the selection circuit 70 may be implemented by a multiplexer (MUX).

Each of the phase detection blocks 95-1, 95-2, . . . , and 95-N may include two MUX's, namely, first and second MUX's 70-1 and 70-2, and the PD 10. The first MUX 70-1 may receive the feedback signals REFπ/16, REF0, REF-π/16, and REF-π/8 each having a multiphase, and the second MUX 70-2 may receive the reference signal SIG.

Since the first MUX 70-1 receives the four feedback signals REFπ/16, REF0, REF-π/16, and REF-π/8 having different phases, the selection circuit 70 may be designed such that the second MUX 70-2 also receives 4 reference signals SIG, in order to synchronize the selection timings of the first and second MUX's 70-1 and 70-2 with each other. According to example embodiments, since the reference signals SIG input to the second MUX 70-2 are substantially the same as each other, the second MUX 70-2 may be implemented as a dummy element.

As described above, the DLL circuit 100 may include the phase detection blocks 95-1, 95-2, . . . , and 95-N and drive them in parallel, thereby increasing a data processing speed. In this regard, first, second, . . . , and K-th delay selection control signals $DSCS_0$, $DSCS_1$, . . . , and $DSCS_{K-1}$ transmitted to the phase detection blocks 95-1, 95-2, . . . , and 95-N, respectively, may be obtained by delaying the selection control signal SCS output from the sigma-delta (ΣΔ) modulator 80 for a desired period of time.

In detail, the delay circuit 90 of the DLL circuit 100 may include a plurality of delay circuits, namely, first through K-th delay circuits 90-1, 90-2, . . . , and 90-K for consecutively delaying the selection control signal SCS output from the sigma-delta (ΣΔ) modulator 80.

For example, the first delay circuit 90-1 may delay the selection control signal SCS output from the sigma-delta (ΣΔ) modulator 80 to generate the first delay selection control signal $DSCS_0$. The first delay selection control signal $DSCS_0$ output from the first delay circuit 90-1 may be transmitted to the selection circuit 70 included in the first phase detection block 95-1. Similarly, the second delay circuit 90-2 may delay the first delay selection control signal $DSCS_0$ output from the first delay circuit 90-1 to generate the second delay selection control signal $DSCS_1$. The second delay selection control signal $DSCS_1$ output from the second delay circuit 90-2 may be transmitted to the selection circuit 70 included in the second phase detection block 95-2. Thus, the number of phase detection blocks 95-1, 95-2, . . . , and 95-N may be the same as the number of delay circuits 90-1, 90-2, . . . , and 90-K. According to example embodiments, the number of phase detection blocks and delay circuits may be different.

The sigma-delta (ΣΔ) modulator 80 may generate and output the selection control signal SCS on the basis of the second signal MCK output from the frequency divider 50. As described above, the selection control signal SCS output from the sigma-delta (ΣΔ) modulator 80 may be delayed by the delay circuit 90 and transmitted to the phase detection blocks 95-1, 95-2, . . . , and 95-N. The sigma-delta (ΣΔ) modulator 80 may receive data (not shown), performs sigma-delta (ΣΔ) modulation on the received data, and output the selection control signal SCS. Thus, digital phase interpolation may be performed by the sigma-delta (ΣΔ) modulator 80, and consequently the DLL circuit 100 according to example embodiments may have an increased phase resolution.

As illustrated in FIG. 1, since the DLL circuit 100 includes the frequency divider 50 and the SRMG 60 having a self referencing feature, the sigma-delta (ΣΔ) modulator 80 may operate at a low frequency without generation of false lock and glitch. Consequently, the design complexity of the sigma-delta (ΣΔ) modulator 80 or the CP 20 may be greatly reduced. In addition, the DLL circuit 100 may effectively remove out-of-band quantization noise by using a hybrid (analog-digital) finite impulse response (FIR) filtering technique.

Figure 2:
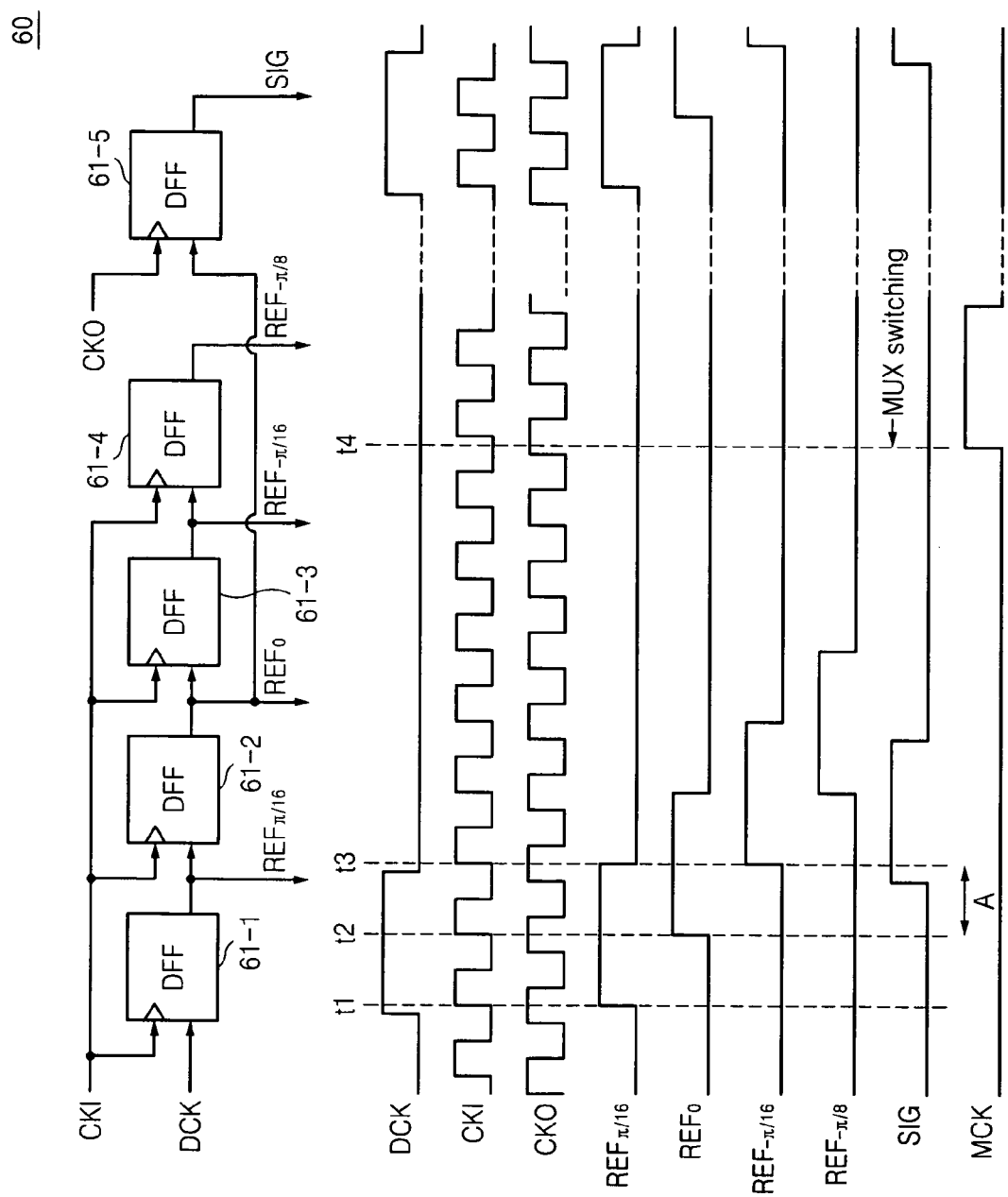
FIG. 2 illustrates a block diagram and a timing diagram of a multiphase generator included in the DLL circuit illustrated in FIG. 1, according to example embodiments.

FIG. 2 illustrates a block diagram and a timing diagram of the SRMG 60. Referring to FIGS. 1 and 2, the SRMG 60 may output the feedback signals REFπ/16, REF0, REF-π/16, and REF-π/8 having different phases and the reference signal SIG on the basis of the output signal CKO output from the VCDL 40, the first signal DCK output from the frequency divider 50, and the input signal CKI. According to example embodiments, the SRMG 60 outputs 4 feedback signals REFπ/16, REF0, REF-π/16, and REF-π/8 and one reference signal SIG.

As illustrated in FIG. 2, the SRMG 60 may include a plurality of D-flip-flops (DFFs), namely, first through fifth DFFs 61-1 through 61-5. Each of the first through fifth DFFs 61-1 through 61-5 may include two input ports and thus latch a signal at one input port corresponding to the time of a rising edge of a signal input to the other input port until the time of the next rising edge.

For example, in FIG. 2, the first DFF 61-1 included in the SRMG 60 may receive the input signal CKI and the first signal DCK and output a first feedback signal, namely, the feedback signal REFπ/16. The first signal DCK has a second level (for example, a high level) at a time t1 corresponding to a rising edge time of the input signal CKI, and thus the first feedback signal REFπ/16 output from the first DFF 61-1 may have the second level (for example, the high level). The first signal DCK maintains the second level (for example, the high level) at a time t2 corresponding to the next rising edge time of the input signal CKI, and thus the first feedback signal REFπ/16 output from the first DFF 61-1 may also maintain the second level (for example, the high level). Next, the first signal DCK has a first level (for example, a low level) at a time t3 corresponding to the second next rising edge time of the input signal CKI, and thus the first feedback signal REFπ/16 output from the first DFF 61-1 may transit from the second level (for example, the high level) to the first level (for example, the low level) at the time t3.

Similarly, the second DFF 61-2 may receive the first feedback signal REFπ/16 output from the first DFF 61-1 and the input signal CKI and consequently output a second feedback signal, namely, the feedback signal REF0, as illustrated in FIG. 2. In FIG. 2, each of the feedback signals REFπ/16, REF0, REF-π/16, and REF-π/8 are output delayed by one clock from each other. In other words, in FIG. 2, the first signal DCK of FIG. 2 may be frequency-divided by 32, and thus each of the feedback signals REFπ/16, REF0, REF-π/16, and REF-π/8 may be delayed for π/16 (=2π/32) from each other and output.

The fifth DFF 61-5 may receive the second feedback signal REF0 output from the second DFF 61-2 and the output signal CKO and output the reference signal SIG. According to example embodiments, a feedback signal input to the fifth DFF 61-5 may be any one of the first through fourth feedback signals REFπ/16 through REF-π/8. However, for sake of convenience, FIG. 2 illustrates input of the second feedback signal REF0 to the fifth DFF 61-5.

As illustrated in FIG. 2, a phase corresponding to the second feedback signal REF0 is sampled by the output signal CKO, and thus the SRMG 60 may have a self-referencing feature. Consequently, false-lock may be effectively prevented due to existence of a section A illustrated in timing diagram of FIG. 2.

Figure 3A:
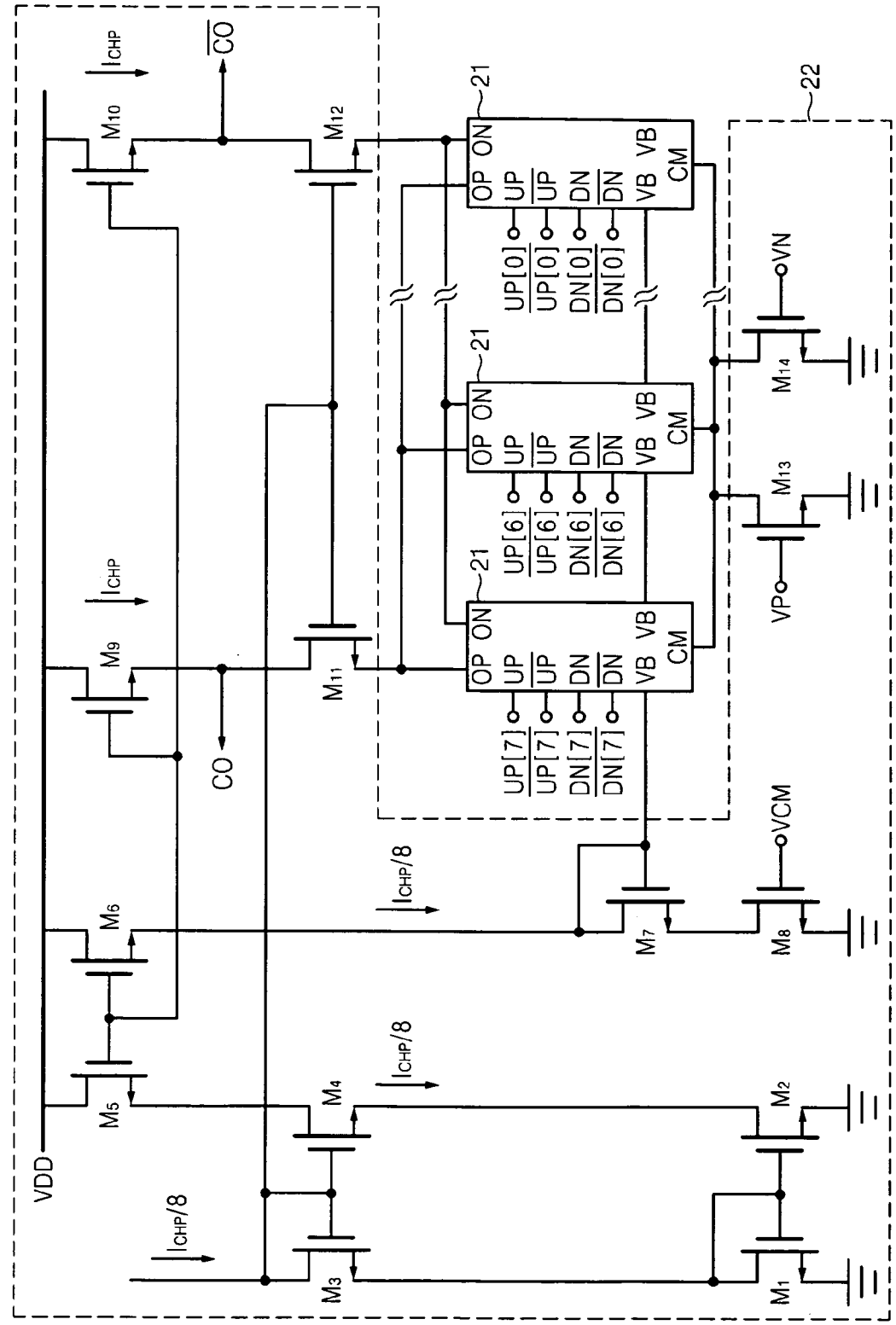
FIG. 3A is a circuit diagram of a charge pump included in the DLL circuit illustrated in FIG. 1.

FIG. 3A is a circuit diagram of the CP 20 included in the DLL circuit 100. Referring to FIGS. 1 through 3A, the CP 20 may include a plurality of current steering blocks 21 for outputting sub charge pump currents on the basis of the control signals UP or DN output from the PDs 10.

The CP 20 may further include a peripheral circuit 22 for summing the sub charge pump currents output from the current steering blocks 21 and generating the charge pump current on the basis of a result of the summation. The peripheral circuit 22 may include a plurality of transistors M1 through M14 and may determine a magnitude of an output voltage CO on the basis of the values of the sub charge pump currents output from the current steering blocks 21.

As illustrated in FIG. 3A, each of the current steering blocks 21 may share nodes OP and ON of the other current steering blocks 21. FIG. 3A illustrates a case where the CP 20 includes 8 current steering blocks 21. Control signals UP[i] or DN[i] (where 0≦i≦7, and i denotes a natural number) input to the current steering blocks 21 may be output from one selected from the phase detection blocks 95-1 through 95-N. The current steering blocks 21 may be driven independently.

Since phase differences from 8 different input signal paths are summed at an output port of the CP 20, a coupling phenomenon and linearity may be important factors in the design of the CP 20. According to example embodiments, differential current steering switches may be used to minimize the coupling phenomenon.

As illustrated in FIG. 3A, the transistors M11 and M12, which are cascode-connected to each other, may isolate the current steering blocks 21 from the LPF 30. Currents output from the current steering blocks 21 may be summed in sources of the cascode-connected transistors M11 and M12. A common mode feedback (CMFB) may be implemented using the transistors M13 and M14, namely, linear transistors M13 and M14, and a voltage applied to a capacitor included in the LPF 30 may be used to control the CMFB. Consequently, high-frequency voltage ripple may be prevented from being generated by resistors included in the LPF 30.

Figure 3B:
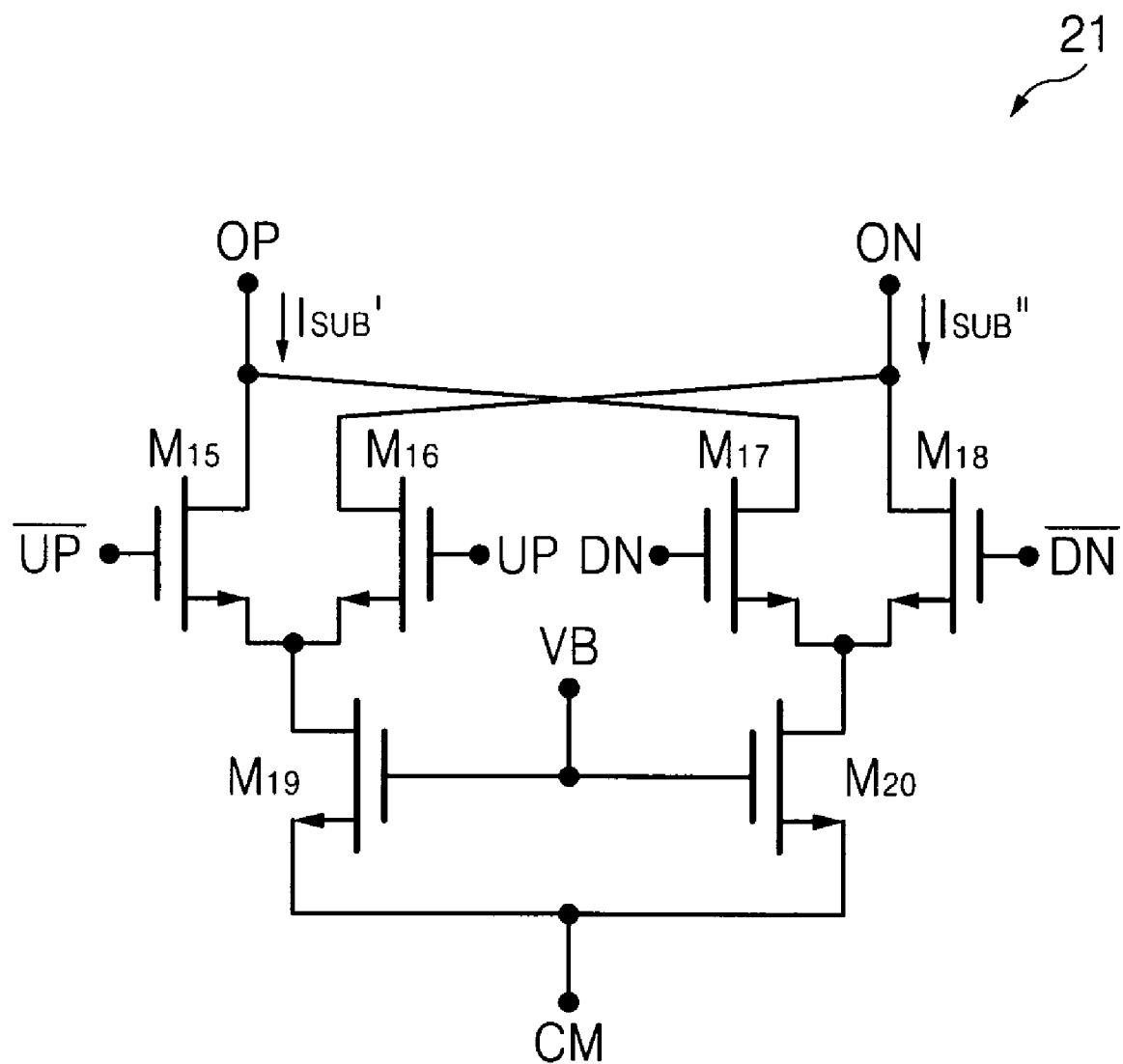
FIG. 3B is a circuit diagram of a current steering block included in the charge pump illustrated in FIG. 3A.

FIG. 3B is a circuit diagram of the current steering blocks 21 illustrated in FIG. 3A. Referring to FIGS. 1 through 3B, the current steering block 21 may control the magnitude of a sub charge pump current $I_{SUB'}$ or $I_{SUB''}$ in response to the control signal UP or DN output from the PD 10. The current steering block 21 may include a plurality of transistors M15 through M20, and the control signal UP may be input to gate of transistor M16 and an inverted version of the control signal UP may be input to gate of transistor M15. The control signal DN output from the PD 10 may be input to gate of transistor M17 and an inverted version of the control signal DN may be input to gate of transistor M18.

Figure 4:
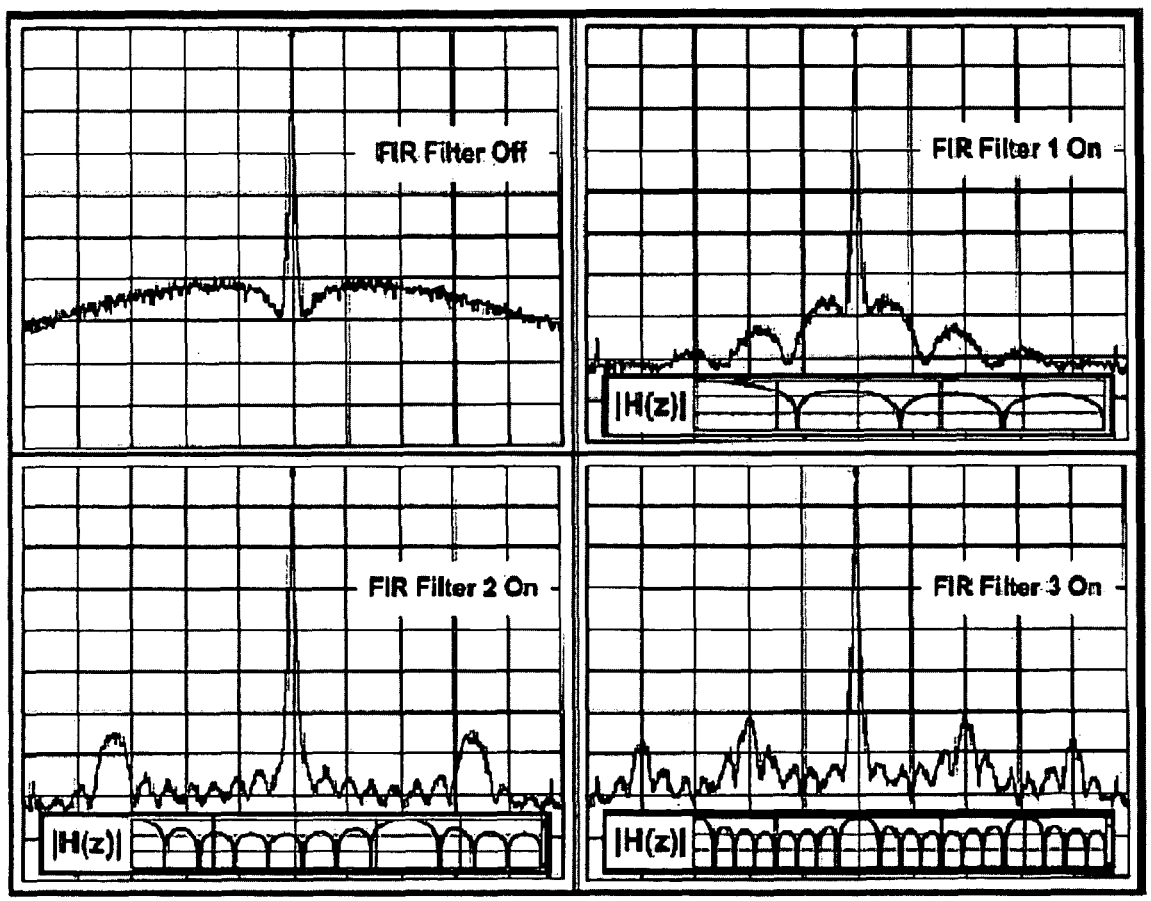
FIG. 4 is a graph illustrating an effect of a finite impulse response (FIR) filtering technique according to example embodiments.

FIG. 4 is a graph illustrating an effect generated when various FIR filtering modes are applied to the DLL circuit 100. Referring to FIGS. 1 through 4, an actual simulation result graph shows that quantization noise was effectively reduced when a hybrid FIR filtering technique is applied to the DLL circuit 100.

Figure 5:
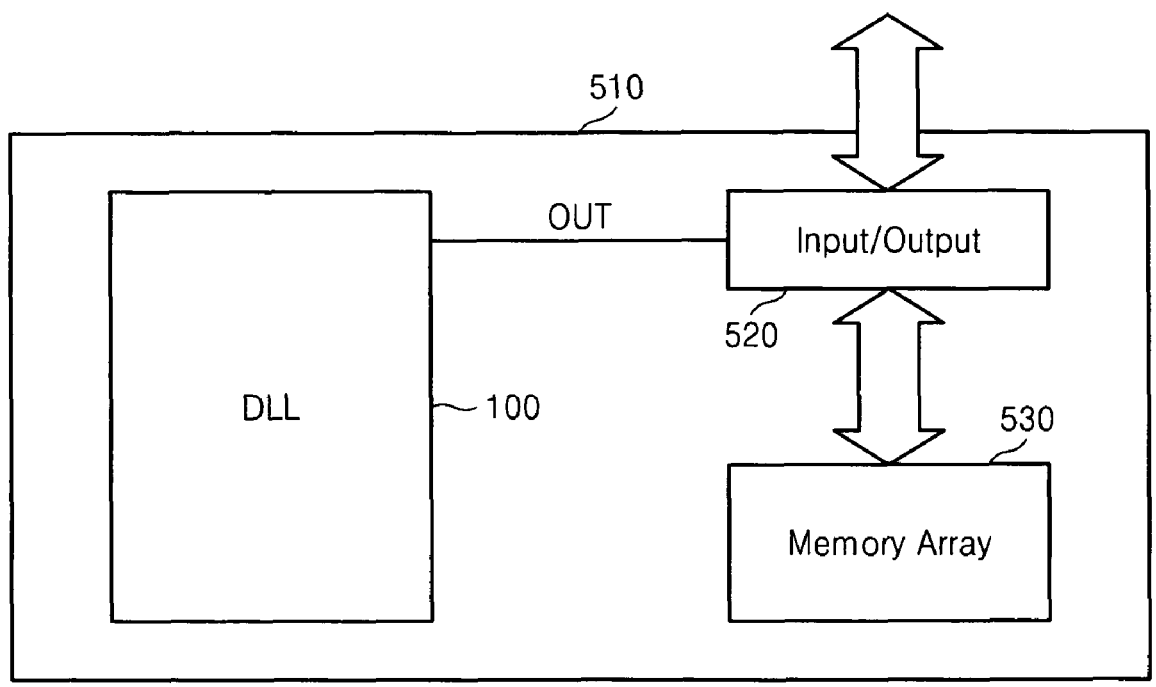
FIG. 5 illustrates a semiconductor memory device including a delay locked loop (DLL), according to example embodiments.

As illustrated in FIG. 5, a DLL circuit 100 according to example embodiments may be included in a semiconductor memory device 510. The semiconductor memory device 510 may include a memory cell array 530, the DLL circuit 100 that generates a plurality of feedback signals having different phases on the basis of a frequency-divided signal obtained by frequency-dividing an input signal and generates an output signal OUT synchronized with the input signal on the basis of one feedback signal selected from the generated feedback signals, and an input/output circuit 520 that transmits first data from an external source to the memory cell array in response to the output signal OUT or transmits second data from the memory cell array to the external source in response to the output signal OUT.

A phase DLL circuit according to example embodiments may provide relatively precise phase resolution. The DLL circuit according to example embodiments may include a frequency divider and thus reduce an operational frequency of a sigma-delta (ΣΔ) modulator and generate multiphase signals for phase interpolation. In addition, the DLL circuit according to example embodiments may effectively reduce quantization noise.

Moreover, the DLL circuit according to example embodiments may acquire precise phase resolution and also generate small noise and consume small power.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A delay locked loop (DLL) circuit comprising:
 a phase control circuit including a voltage-controlled delay line (VCDL) configured to generate an output signal based on a feedback signal output in response to a plurality of control signals, and an input signal;
 a plurality of phase detection circuits, each phase detection circuit configured to compare a phase of a signal selected from a signal set, the signal set including signals with different phases, with a phase of a reference signal and configured to output a control signal of the plurality of control signals that corresponds to a phase difference between the selected signal and the reference signal;
 a multiphase generation circuit configured to output the signal set based on the signal output from the phase control circuit, the input signal, and a first frequency-divided signal obtained by dividing a frequency of the input signal; and
 a sigma-delta (ΣΔ) modulation circuit configured to output a plurality of delay selection control signals having different phases and transmit the plurality of delay selection control signals to the plurality of phase detection circuits, the plurality of delay selection control signals output in response to a second frequency-divided signal having a phase different from a phase of the first frequency-divided signal.

2. The DLL circuit of claim 1, wherein each of the plurality of phase detection circuits comprises:
 a selection circuit configured to select the signal from the signal set in response to a corresponding selection control signal of the plurality of selection control signals; and
 a phase detector (PD) configured to output the control signal corresponding to the phase difference between the selected signal selected by the selection circuit and the reference signal.

3. The DLL circuit of claim 1, wherein the multiphase generation circuit comprises:
 a frequency divider configured to divide the frequency of the input signal to generate the first frequency-divided signal and the second frequency-divided signal; and
 a self-referenced multiphase generator (SRMG) configured to output the multiphase signal set and the reference signal in response to the output signal of the VCDL, the input signal, and the first frequency-divided signal.

4. The DLL circuit of claim 3, wherein the sigma-delta (ΣΔ) modulation circuit comprises:
- a ΣΔ modulator configured to generate a selection control signal in response to the second frequency-divided signal output from the frequency divider; and
- a delay circuit configured to generate the plurality of delay selection control signals by delaying the selection control signal output from the ΣΔ modulator and to transmit the plurality of delay selection control signals to the plurality of phase detection circuits.

5. The DLL circuit of claim 2, wherein:
the phase control circuit further includes a charge pump (CP) configured to generate a charge pump current in response to the control signal output from each of the plurality of phase detection circuits, wherein the CP includes
- a plurality of current steering blocks, each configured to output a sub-charge pump current on the basis of the control signal output from one of the plurality of PDs; and
- a peripheral circuit configured to sum the sub-charge pump currents output from the plurality of current steering blocks and to generate the charge pump current based on a result of the summation.

6. The DLL circuit of claim 5, wherein the plurality of current steering blocks operate independently.

7. The DLL circuit of claim 3, wherein the SRMG comprises:
- a plurality of first D-flip-flops (DFFs) configured to output the signal set including signals with different phases in response to the input signal and the first frequency-divided signal; and
- a second DFF configured to output the reference signal in response to one of the signals of the signal set output from the plurality of first DFFs and the signal output by the VCDL.

8. A semiconductor memory device comprising:
- a memory cell array;
- a delay locked loop (DLL) circuit configured to generate a plurality of feedback signals based on a first frequency-divided signal obtained by frequency-dividing an input signal, the generated feedback signals having different phases, and the DLL configured to generate an output signal synchronized with the input signal based on at least one feedback signal of the generated feedback signals; and
- an input/output circuit configured to transmit a first data from an external source to the memory cell array in response to the output signal or transmit a second data from the memory cell array to the external source in response to the output signal.

9. The semiconductor memory device of claim 8, wherein the DLL circuit comprises:
- a frequency divider configured to divide a frequency of the input signal to output the first frequency-divided signal and a second frequency-divided signal; and
- a sigma-delta (ΣΔ) modulator configured to operate based on the second frequency-divided signal output from the frequency divider, and output a selection control signal, the output selection control signal adjusting a phase resolution of the DLL circuit.

10. The semiconductor memory device of claim 9, wherein the DLL circuit comprises:
- a self-referenced multiphase generator (SRMG) configured to generate the feedback signals having different phases, the feedback signals generated based on the input signal, the first frequency-divided signal, and the output signal of the DLL circuit; and
- a selection circuit configured to select one feedback signal from the feedback signals generated by the SRMG based on the selection control signal.

11. The semiconductor memory device of claim 8, wherein the DLL circuit comprises:
- a phase control circuit including a voltage-controlled delay line (VCDL) configured to output a signal based on the output signal generated by the DLL circuit and the input signal;
- a plurality of phase detection circuits, each phase detection circuit configured to compare a phase of at least one feedback signal of the generated feedback signals with a phase of a reference signal and configured to output a control signal that corresponds to a phase difference between the at least one feedback signal and the reference signal;
- a multiphase generation circuit configured to output the plurality of feedback signals in response to the signal output from the phase control circuit, the input signal, and the first frequency-divided signal; and
- a sigma-delta (ΣΔ) modulation circuit configured to output a plurality of delay selection control signals having different phases and transmit the plurality of delay selection control signals to the plurality of phase detection circuits, the plurality of delay selection control signals output in response to a second frequency-divided signal having a phase different from a phase of the first frequency-divided signal.

12. The semiconductor memory device of claim 11, wherein each of the plurality of phase detection circuits comprises:
- a selection circuit configured to select the at least one feedback signal of the generated feedback signals in response to a corresponding delay selection control signal of the plurality of delay selection control signals output from the sigma-delta (ΣΔ) modulation circuit; and
- a phase detector (PD) configured to output the control signal corresponding to the phase difference between the at least one feedback signal selected by the selection circuit and the reference signal.

13. The semiconductor memory device of claim 11, wherein the multiphase generation circuit comprises:
- a frequency divider configured to divide the frequency of the input signal to generate the first frequency-divided signal and the second frequency-divided signal; and
- a self-referenced multiphase generator (SRMG) configured to generate the plurality of feedback signals having different phases and the reference signal in response to the output signal of the VCDL, the input signal, and the first frequency-divided signal.

14. The semiconductor memory device of claim 13, wherein the sigma-delta (ΣΔ) modulation circuit comprises:
- a ΣΔ modulator configured to generate a selection control signal in response to the second frequency-divided signal output from the frequency divider; and
- a delay circuit configured to generate the plurality of delay selection control signals by delaying the selection control signal output from the ΣΔ modulator and to transmit the plurality of delay selection control signals to the plurality of phase detection circuits.

15. The semiconductor memory device of claim 12, wherein:
the phase control circuit further includes a charge pump (CP) configured to generate a charge pump current in response to the control signal output from each of the plurality of phase detection circuits, wherein the CP includes
  a plurality of current steering blocks, each configured to output a sub-charge pump current based on the control signal output from one of the plurality of PDs; and
  a peripheral circuit configured to sum the sub-charge pump currents output from the plurality of current steering blocks and to generate the charge pump current based on a result of the summation.

16. The semiconductor memory device of claim 15, wherein the plurality of current steering blocks operate independently.

17. The semiconductor memory device of claim 13, wherein the SRMG comprises:
  a plurality of first D-flip-flops (DFFs) configured to generate the plurality of feedback signals having different phases in response to the input signal and the first frequency-divided signal; and
  a second DFF configured to output the reference signal in response to at least one of the plurality of feedback signals generated by the plurality of first DFFs and the signal output by the VCDL.

* * * * *